United States Patent [19]
Kondo et al.

[11] Patent Number: 5,828,117
[45] Date of Patent: Oct. 27, 1998

[54] THIN-FILM SOLAR CELL

[75] Inventors: Masataka Kondo, Kobe; Katsuhiko Hayashi, Otsu; Atsuo Ishikawa, Otsu; Shinichiro Kurata, Otsu; Hideo Yamagishi, Kyoto, all of Japan

[73] Assignee: Kanegafuchi Kagaku Kogyo Kabushiki Kaisha, Osaka, Japan

[21] Appl. No.: 859,687

[22] Filed: May 21, 1997

Related U.S. Application Data

[63] Continuation of Ser. No. 647,893, filed as PCT/JP95/02030, Oct. 4, 1995, published as WO96/11500, Apr. 18, 1996, abandoned.

[30] Foreign Application Priority Data

Oct. 6, 1994 [JP] Japan ..................................... 6-242508
Oct. 6, 1994 [JP] Japan ..................................... 6-242509
Sep. 22, 1995 [JP] Japan ..................................... 7-244849

[51] Int. Cl.⁶ ...................... H01L 31/075; H01L 31/105; H01L 31/117
[52] U.S. Cl. ........................ 257/458; 136/258; 257/461; 438/57
[58] Field of Search ............................ 257/458, 460–461; 438/57; 136/258

[56] References Cited

U.S. PATENT DOCUMENTS

| | | | |
|---|---|---|---|
| 5,024,706 | 6/1991 | Kanai | 136/258 |
| 5,248,349 | 9/1993 | Foote et al. | 136/260 |
| 5,282,902 | 2/1994 | Matsuyama | 136/249 |
| 5,324,365 | 6/1994 | Niwa | 136/256 |
| 5,338,370 | 8/1994 | Aoike | 136/258 |
| 5,342,452 | 8/1994 | Saito et al. | 136/256 |
| 5,352,300 | 10/1994 | Niwa | 136/256 |
| 5,612,229 | 3/1997 | Yoshida | 437/4 |

*Primary Examiner*—Mahshid D. Saadat
*Assistant Examiner*—Allan R. Wilson
*Attorney, Agent, or Firm*—Armstrong, Westerman, Hattori, McLeland & Naughton

[57] ABSTRACT

The invention provides two kinds of structures for a thin-film solar cell that is improved in the adhesive strength and reflectance of a back surface electrode layer. According to the first structure, in a thin-film solar cell in which a transparent electrode layer, a thin-film semiconductor layer, and a back surface electrode layer are laid in stated order on an insulative transparent substrate, the back surface electrode layer consists of a first transparent conductive metal compound layer having a smaller refractive index than a semiconductor that constitutes the thin-film semiconductor layer, a second transparent conductive metal compound layer, and a metal layer. The second transparent conductive metal compound layer contains at least one of components of the first transparent conductive metal compound layer and a component of the metal layer. According to the second structure, in a thin-film solar cell in which a transparent electrode layer, a thin-film semiconductor layer, and a back surface electrode layer are laid in order on an insulative transparent substrate, the back surface electrode layer is a layered body consisting of a silver thin film, and an intermediate thin layer containing silver, oxygen, and a metal element constituting a transparent conductive metal oxide.

6 Claims, 3 Drawing Sheets

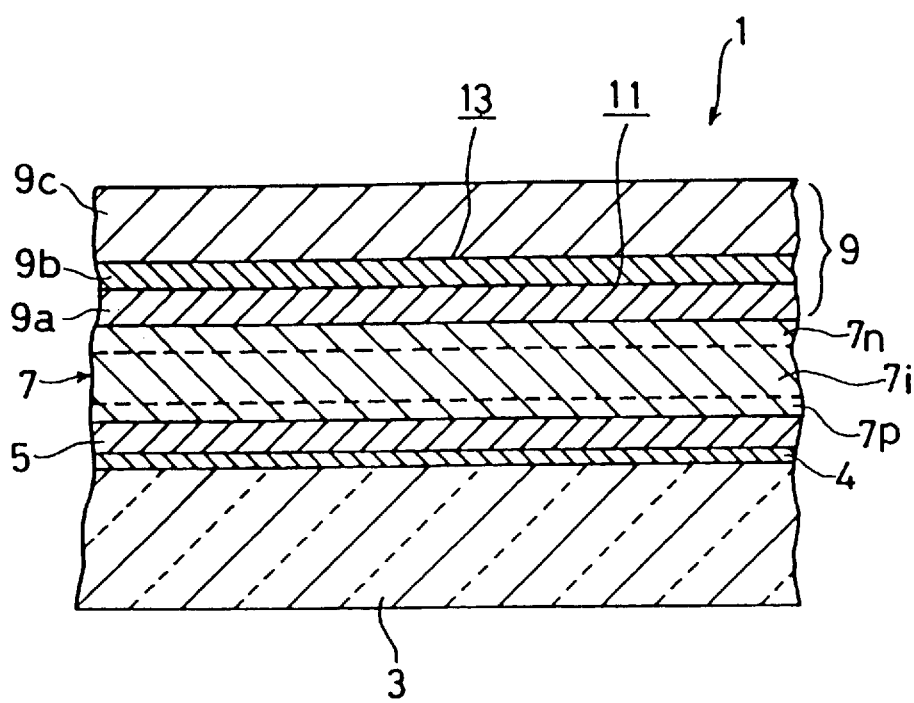
F I G. 1

THIN-FILM SOLAR CELL

This application is a Continuation of application Ser. No. 08/647,893, filed as PCT/JP95/02030 Oct. 4, 1995, published as WO96/11500 Apr. 18, 1996, now abandoned.

FIELD OF THE INVENTION

The present invention relates to a thin-film solar cell in which a thin-film semiconductor layer and electrode layers are laid one on another on a substrate. In particular, the invention relates to a thin-film solar cell in which both of adhesive strength on a practical level and superior back surface reflection effect are attained by laying, on a thin-film semiconductor layer with high adhesive strength, an electrode material, such as silver, which could not be used as a back surface electrode layer of a thin-film solar cell in spite of its high reflectance because it has low adhesive strength when bonded to a semiconductor material.

BACKGROUND OF THE INVENTION

Conventionally, thin-film solar cells using, for instance, an amorphous silicon thin film are constructed such that a transparent electrode layer, a thin-film semiconductor layer, a back surface electrode layer are laid one on another sequentially on an insulative transparent substrate. Electron-hole pairs are generated in the thin-film semiconductor layer by light that is incident from the insulative transparent substrate side. Electric power is generated by taking out electrons and holes through the transparent electrode layer and the back surface electrode layer, respectively, by utilizing an internal electric field of a pn junction.

Various improvements have been made of such thin-film solar cells to obtain even a small increase in the quantity of light incident on the thin-film semiconductor layer. Among those improvements is a structure in which a transparent electrode layer, an amorphous silicon layer having a p-i-n junction as a thin-film semiconductor layer, and a back surface electrode layer are sequentially laid on an insulative transparent substrate. The back surface electrode layer is a silver electrode which has a high reflectance in an effective wavelength range. The quantity of light reaching the thin-film semiconductor layer is increased by allowing incident light to be subjected to multiple reflection between the back surface electrode layer and the transparent electrode layer. This structure is intended to effectively utilize long-wavelength light that first passes through the thin-film semiconductor layer by increasing the reflectance of the back surface electrode layer, to thereby increase photocurrent.

As described above, silver is commonly used as a back surface electrode material having a high reflectance.

However, silver itself has low adhesive strength when bonded to a thin-film semiconductor or ceramics. Therefore, to obtain adhesive strength on a practical level for use as a back surface electrode of a thin-film solar cell, a silver layer is sintered by, for instance, a heat treatment or even an impurity is added to it. However, exposure to a high-temperature atmosphere in a heat treatment is not suitable for a thin-film semiconductor in terms of a diffusion rate of a metal component. The addition of an impurity considerably reduces the reflectance of the silver layer, to disable the above-mentioned effective utilization of long-wavelength light. Thus, the prior art has a problem that a single silver layer cannot be put to practical use as a back surface electrode of a thin-film solar cell.

On the other hand, there have been proposed high-reflectance back surface electrode structures in which a high-reflectance metal layer of silver, aluminum, or the like is laid on a transparent conductive metal compound layer of indium tin oxide, tin oxide, zinc oxide, cadmium sulfide, or the like. However, in case of the aluminum layer, the adhesive strength is lower than a case where a single aluminum layer is directly laid on a thin-film semiconductor. In case of the silver layer, although the adhesive strength is higher than a case where a single silver layer is directly laid on a thin-film semiconductor, it is never on a practical level. Actually, these back surface electrode structures have been used only to provide best data for presentation in society conferences.

SUMMARY OF THE INVENTION

The present inventors have solved the above problems and developed a thin-film solar cell having a back surface electrode structure that satisfies both of a high reflectance and high adhesive strength when bonded to a thin-film semiconductor layer. This thin-film solar cell has a structure in which the thin-film semiconductor layer and the back surface electrode layer are bonded to each other so as to avoid bonding between different materials. Specifically, according to a first aspect of the invention, there is provided a thin-film solar cell including a transparent electrode layer; a thin-film semiconductor layer; and a back surface electrode layer which are laid in stated order on an insulative transparent substrate and comprising: a first transparent conductive metal compound layer having a smaller refractive index than a semiconductor that constitutes the thin-film semiconductor layer; a second transparent conductive metal compound layer; and a metal layer, wherein the second transparent conductive metal compound layer contains at least one of components of the first transparent conductive metal compound layer and a component of the metal layer. It is preferred that the first transparent conductive metal compound layer comprises a metal oxide, specifically any one selected from indium tin oxide (hereinafter referred to simply as ITO), tin oxide (hereinafter referred to simply as $SnO_2$), or zinc oxide (hereinafter referred to simply as ZnO). Where the thin-film semiconductor layer is made of one of copper indium selenide (hereinafter referred to simply as $CuInSe_2$)-type semiconductors or is a composite film thereof, it is preferred that the first transparent conductive metal compound layer comprises cadmium sulfide (hereinafter abbreviated simply as CdS).

According to a second aspect of the invention, there is provided a thin-film solar cell including a transparent electrode layer; a thin-film semiconductor layer; and a back surface electrode layer which are laid in stated order on an insulative transparent substrate, wherein the back surface electrode layer comprises a layered body comprising; a silver thin film; and an intermediate thin layer containing silver, oxygen, and a metal element constituting a transparent conductive metal oxide. It is particularly preferred that the metal element constituting the transparent conductive metal oxide comprises zinc (hereinafter referred to simply as Zn).

An example of a manufacturing method of the above thin-film solar cell according to the first aspect of the invention is as follows. First, a transparent electrode layer and a thin-film semiconductor layer are laid in order on an insulative transparent substrate. After a first transparent conductive metal compound layer is laid on the thin-film semiconductor layer, the substrate on which the first transparent conductive metal compound layer is formed is moved through a plurality of adjacent plasma regions of a transparent conductive metal compound and a metal formed in a reaction chamber from the transparent conductive metal compound side to the metal side. As a result, a back surface electrode layer consisting of a first transparent conductive metal compound layer, a second transparent conductive metal compound layer, and a metal layer is laid on the thin-film semiconductor layer. The thin-film solar cell according to the first aspect of the invention can be produced with high reproducibility by employing the following techniques. While the plurality of plasma regions are formed by applying a voltage to a sputtering target, the plurality of plasma regions are overlapped with each other. As for discharge power densities for formation of the plurality of plasma regions, the discharge power density in forming the second transparent conductive metal compound layer is made not higher than 10% of that in forming the metal layer. Among the plurality of plasma regions, the plasma region of the second transparent conductive metal compound is formed by induction energy or parasitic discharge produced by the discharge power for formation of the plasma region of the metal. A transparent conductive metal compound used for formation of one of the plurality of plasma regions is made the same as a material of the first transparent conductive metal compound layer.

Conventionally, a silver (hereinafter referred to simply as Ag) layer or an aluminum (hereinafter referred to simply as Al) layer is directly laid on the first transparent conductive metal compound layer as mentioned above. However, since this means the contact of different materials, the adhesive strength is insufficient as described above.

In contrast, in the thin-film solar cell according to the first aspect of the invention, the substrate is passed through the plurality of adjacent plasma regions of the transparent conductive metal compound and the metal in laying the second transparent conductive metal compound layer and the metal layer on the first transparent conductive metal compound layer. Therefore, the composition of the second transparent conductive metal compound layer can be made such that the content of the metal layer component in the second transparent conductive metal compound layer continuously increases from the boundary with the first transparent conductive metal compound layer to the boundary with the metal layer. Since there is no contact of different materials in the two boundaries unlike the conventional case, high adhesive strength can be obtained.

A gradient of the content of the metal layer component in the second transparent conductive metal compound layer occurs in the following manner. Since the plurality of plasma regions are generated adjacent to each other, there occurs a mixed region of the two adjacent plasma regions because active species that constitute the respective plasma regions diffuse under a low pressure in a reaction chamber. The gradient occurs due to the movement of the substrate through the mixed region. That is, in each of the plasma regions for formation of the second transparent conductive metal compound layer and the metal layer, the active species for the associated layer exists at a higher probability. Therefore, the gradient of the content of the metal layer component can be formed by moving the substrate on which the first transparent conductive metal compound layer is formed through the plurality of plasma regions.

The second transparent conductive metal compound layer can be made as thin as possible by making, among discharge power densities for formation of the plurality of plasma regions, the discharge power density in forming the second transparent conductive metal compound layer not higher than 10% of that in forming the metal layer, or forming, among the plurality of plasma regions, the plasma region of the second transparent conductive metal compound by induction energy or parasitic discharge produced by the discharge power for formation of the plasma region of the metal. In other words, since it is provided only for securing sufficient adhesive strength between the first transparent conductive metal compound layer and the metal layer, it is desired that the second transparent conductive metal compound layer be as thin as possible. The discharge power in forming the second transparent conductive metal compound layer exceeding 10% of that in forming the metal layer is not desirable, because the metal content of the second transparent conductive metal compound layer becomes too small, which means that contact of different materials occurs between the second transparent conductive metal compound layer and the metal layer, thereby disabling the improvement in the adhesive strength which is intended by the invention.

If a transparent conductive metal compound used for formation of one of the plurality of plasma regions is made the same as a material of the first transparent conductive metal compound layer, the contact between the first and second transparent conductive metal compound layers becomes close to contact between the same materials. This contributes to the improvement in adhesive strength.

The use of any one selected from ITO, $SnO_2$, ZnO or CdS as the first transparent conductive metal compound makes the first transparent conductive metal compound layer highly stable with respect to the thin-film semiconductor. The use of Ag or Al as the metal allows the back surface electrode to have a high reflectance.

Next, a description will be made of a manufacturing method of the thin-film solar cell according to the second aspect of the invention. First, a transparent electrode layer and a thin-film semiconductor layer are laid in order on an insulative transparent substrate. Thereafter, the substrate on which the transparent electrode layer and the thin-film semiconductor layer are formed are moved through a very weak plasma region of a transparent conductive metal oxide and an ordinary plasma region of Ag from the side of the very weak plasma region of the transparent conductive metal oxide to the ordinary Ag plasma region side in a reaction chamber of a magnetron-type in-line sputtering apparatus. As a result, an intermediate thin layer containing Ag, O, and a metal element constituting the transparent conductive metal oxide, and an Ag thin film are laid in order on the thin-film semiconductor layer. Thus, a layered body consisting of the intermediate thin layer and the Ag thin film which are laid on the thin-film semiconductor layer serves as a back surface electrode layer.

Conventionally, an Ag thin film is directly laid on the thin-film semiconductor layer as mentioned above. However, in this case, the adhesive strength is insufficient as described above.

In contrast, in the invention, since the intermediate thin layer is interposed between the thin-film semiconductor layer and the Ag thin film, no contact of different materials occurs between the intermediate thin layer and the Ag thin film and between the intermediate thin layer and the thin-film semiconductor layer. Therefore, high adhesive strength can be obtained.

An example of a method of producing the very weak plasma region of the transparent conductive metal oxide is as follows. The transparent conductive metal oxide is assumed to be ZnO. The reason for using ZnO is that it allows a thin-film solar cell to be stable in its characteristics because Zn is relatively stable with respect to silicon; and when used in the back surface electrode layer of a thin-film solar cell, ZnO does not much influence the thin-film semiconductor layer through diffusion.

For example, a ZnO target and an Ag target are disposed along the substrate moving direction in the reaction chamber of the sputtering apparatus, and a discharge voltage is applied to only the Ag target in a low-pressure atmosphere with a flow of an argon (hereinafter referred to simply as Ar) gas. As a result, plasma generated in the Ag target section extends to the adjacent ZnO target section. The ZnO surface is subjected to slight sputtering by Ar atoms existing in the extended plasma. When the substrate on which the transparent electrode layer and the thin-film semiconductor layer are formed reaches this region, Zn atoms and O atoms slightly sputtered are mixed with Ag atoms sputtered from the adjacent Ag target, whereby an intermediate thin layer made of an Ag-O-Zn mixture or ternary alloy is deposited on the thin-film semiconductor layer.

The substrate continues to move toward the Ag target section, and in the vicinity of the Ag target only an Ag thin film is deposited on the intermediate thin layer. In this manner, a back surface electrode layer is formed such that the Ag thin film is formed over the thin-film semiconductor layer through the intermediate thin layer containing Ag, O and Zn.

The above-described structures provide the following advantages. In the thin-film solar cell according to the first aspect of the invention, since the contact between the first transparent conductive metal compound layer and the metal layer is not contact of different materials, the adhesive strength of the back surface electrode layer is greatly improved so as to be well on a practical level. Further, since the material of the first transparent conductive metal compound layer can be selected from CdS and metal oxides such as ITO, $SnO_2$ and ZnO depending on the material of the thin-film semiconductor layer, the degree of freedom in selecting the thin-film semiconductor material is not reduced.

As described above, in the thin-film solar cell according to the first aspect of the invention, the composition of the second transparent conductive metal compound layer of the back surface electrode layer varies such that the content of the component of the metal layer in the second transparent conductive metal compound layer continuously increases from the boundary with the first transparent conductive metal compound layer to the boundary with the metal layer. This gradient of the content of the metal layer component in the second transparent conductive metal compound layer can be obtained simply by disposing a plurality of plasma regions adjacent to each other, diffusing active species that constitute each plasma under a low pressure in a reaction chamber, and moving a substrate on which the first transparent conductive metal compound layer is formed through a mixed region of the two plasma regions. Therefore, the thin-film solar cell according to the first aspect of the invention can be produced without using an apparatus having a special, complex mechanism. Further, since discontinuity at the boundary between the thin-film semiconductor layer and back surface electrode layer can be eliminated, the short-circuit current density can be increased as well as both of the adhesive strength of the back surface electrode layer and the power generation characteristic can be improved.

Also in the thin-film solar cell according to the second aspect of the invention, since there occurs no contact of different materials between the thin-film semiconductor layer and the intermediate thin layer and between the Ag thin film and the intermediate thin layer, the strength of adhesion between, for instance, amorphous silicon and an Ag thin film can be improved greatly, which was difficult in the art. In addition to the improvement in the adhesive strength, since discontinuity at the boundary between the thin-film semiconductor layer and the back surface electrode layer is eliminated, light incident from the side opposite to the back surface electrode layer is efficiently reflected by the boundary with the back surface electrode layer, whereby the short-circuit current density of the thin-film solar cell can be improved. This thin-film solar cell can be produced by a very simple method by using a sputtering apparatus in which a target of a transparent conductive metal compound material and an Ag target are disposed adjacent to each other. More specifically, plasma is generated by supplying discharge power to only the Ag target, forming a very weak sputtering region in the vicinity of the target of the transparent conductive metal compound material under the influence of the Ag plasma, and moving a substrate on which the transparent electrode layer and the thin-film semiconductor layer are formed through the very weak sputtering region from the transparent conductive metal compound side to the Ag side. Therefore, the thin-film solar cell can be produced without using an apparatus having a special, complex mechanism.

BRIEF DESCRIPTION OF THE DRAWINGS

FIG. 1 is a sectional view showing the structure of a thin-film solar cell according to a first aspect of the present invention;

DESCRIPTION OF THE PREFERRED EMBODIMENTS

Figure 2:
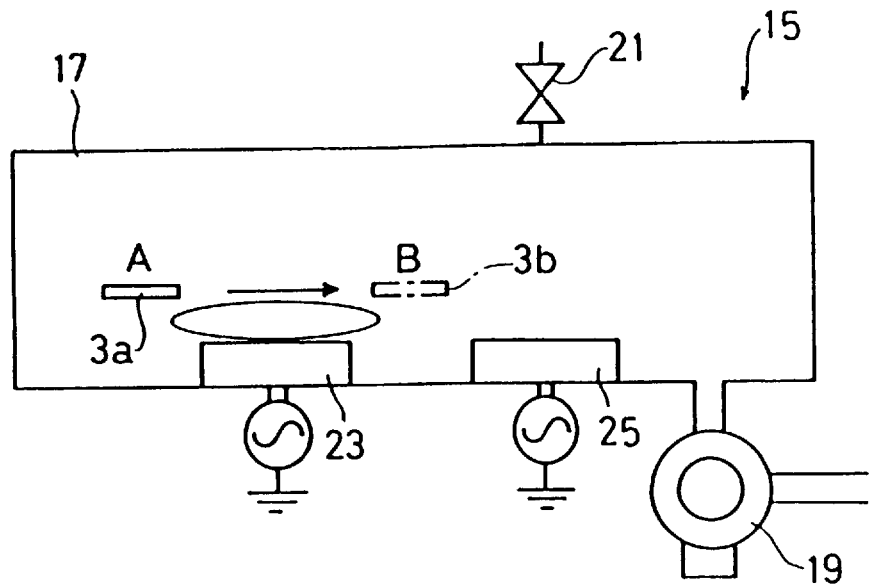
FIGS. 2 and 3 illustrate Manufacturing Example 1.

Details of thin-film solar cells according to the present invention will be hereinafter described by way of specific embodiments, starting from an embodiment of a thin-film solar cell according to a first aspect of the invention.

FIG. 1 is a sectional view showing the structure of a thin-film solar cell 1 according to the first aspect of the invention. The thin-film solar cell 1 is constructed by laying in order a transparent electrode layer 5, a thin-film semiconductor layer 7, and a back surface electrode layer 9 on an insulative transparent substrate 3. The back surface electrode layer 9 has a three-layer structure consisting of a first transparent conductive metal compound layer 9a, a second transparent conductive metal compound layer 9b, and a metal layer 9c. The second transparent conductive metal compound layer 9b contains at least one of the components of the first transparent conductive metal compound layer 9a and the component of the metal layer 9c. In this embodiment, the first transparent conductive metal compound layer 9a is made of ZnO, the metal layer 9c is made of Ag or Al, and the second transparent conductive metal compound layer 9b is made of a ZnO-based material. If necessary, an undercoat 4 made of silicon oxide (hereinafter referred to simply as $SiO_2$) may be formed on the insulative transparent substrate 3 as a layer for preventing intrusion of impurities, as shown in FIG. 1.

This structure is produced by a manufacturing method described below. The composition of the second transparent conductive metal compound layer 9b continuously varies in its thickness direction. More specifically, in the second transparent conductive metal compound layer 9b, the ZnO proportion is high in the vicinity of a boundary 11 on the side of the first transparent conductive metal compound layer 9a and, conversely, the proportion of the metal component (Ag or Al in this embodiment) is high in the vicinity of a boundary 13 on the side of the metal layer 9c. That is, the composition of the second conductive metal compound layer 9b continuously varies from ZnO-rich to metal-rich as the position goes from the side of the first transparent conductive metal compound layer 9a to the side of the metal layer 9c.

Therefore, at the top and bottom boundaries 13 and 11 of the second transparent conductive metal compound layer 9b, there occurs no contact of different materials unlike the conventional case, so that high adhesive strength can be obtained there. It was confirmed that the second transparent conductive metal compound layer 9b as thin as about 20 Å could sufficiently improve the adhesive strength.

Incidentally, in FIG. 1, the thin-film semiconductor layer 7 has a p-i-n junction formed by a p-type hydrogenated amorphous silicon carbide (hereinafter referred to simply as a-SiC:H) layer 7p, an i-type hydrogenated amorphous silicon (hereinafter referred to simply as a-Si:H) layer 7i, and an n-type hydrogenated microcrystalline silicon (hereinafter referred to simply as $\mu$c-Si;H) layer 7n.

Examples of manufacture of the thin-film solar cell shown in FIG. 1 will be described below.

MANUFACTURING EXAMPLE 1

A glass substrate coated with a 500-Å-thick $SiO_2$ layer 4 is used as an insulative transparent substrate 3. A transparent electrode layer 5 is laid on the substrate 3 by forming a fluorine-added $SnO_2$ film at a thickness of about 8,000 Å. To reduce loss of light by reflection, the surface of the $SnO_2$ film is formed with minute asperities.

Thereafter, a thin-film semiconductor layer 7 is formed by successively laying 150-Å-thick p-type a-SiC:H layer, a 4,000-Å-thick i-type a-Si:H layer, and a 500-Å-thick $\mu$c-Si:H layer on the transparent electrode layer 5 by using a plasma CVD apparatus.

Subsequently, as shown in FIG. 2, after a substrate 3a on which the above layers have been formed is set at a substrate position A in a reaction chamber 17 of a magnetron-type in-line sputtering apparatus 15, the reaction chamber 17 is evacuated with a vacuum pump 19 to $6\times10^{-6}$ torr. In a state that an Ar gas is introduced through a gas system 21 and the internal pressure is kept at $3\times10^{-3}$ torr, a ZnO target 23 is subjected to sputtering by energizing it at a RF power density of 0.8 W/cm$^2$ while the substrate 3a is moved, whereby a 800-Å-thick first transparent conductive metal compound layer 9a is formed on the thin-film semiconductor layer 7 (substrate position B). An example of the ZnO target 23 is a ZnO target added with Al at 5% in the form of aluminum oxide (hereinafter referred to simply as $Al_2O_3$). The gap between the ZnO target 23 and the substrate 3a is set at about 5 cm, for instance. Although in this sputtering apparatus 15 an Ag target 25 is disposed adjacent to the ZnO target 23 as shown in FIG. 2, no discharging is effected with the Ag target 25 during formation of the first transparent conductive metal compound layer 9a.

After a substrate 3b on which the first transparent conductive metal compound layer 9a is formed is returned to the substrate position A, discharging is effected with both of the Ag target 25 and the ZnO target 23 by energizing those at RF power densities of 0.8 W/cm$^2$ and 0.05 W/cm$^2$, respectively.

Figure 3:
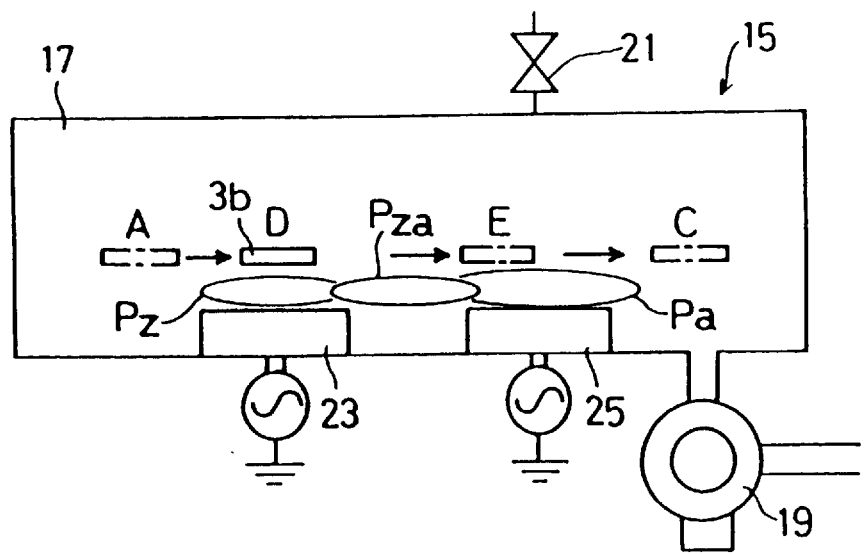

As a result, as shown in FIG. 3, two plasma regions Pz and Pa are formed over the ZnO target 23 and the Ag target 25, respectively, and also formed is an overlapping region of the two plasma regions Pz and Pa, that is, a very weak plasma region Pza where active species of the two plasma regions Pz and Pa are mixed.

In this discharging state, as the substrate 3b on which the first transparent conductive metal compound layer 9a is formed is moved from the substrate position A to a substrate position C, a second transparent conductive metal compound layer 9b and a metal (Ag) layer 9c are continuously formed. The second transparent conductive metal compound layer 9b has a thickness of about 20 Å.

Since the discharge power density of the ZnO target 23 is not higher than 10% of that of the Ag target 25 and is hence very low, slight ZnO starts to be laid on the substrate 3b in the vicinity of the ZnO target 23 (substrate position D). As the substrate 3b moves, the active species of Ag existing in the plasma region Pza starts to be laid on the substrate 3b. This is because when the discharge power density is reduced to 10% or less, the sputtering film formation rate decreases by one or several orders. As the substrate 3b is subsequently moved from the plasma region Pza to the plasma region Pa, the proportion of Ag in the amount of active species that contribute to the deposition gradually increases. When the substrate 3b comes close to the Ag target 25 (substrate position E), a metal layer 9c of almost 100% Ag is formed because the Ag target 25 is given a sufficiently high discharge power density.

Thus, in this example, the second transparent conductive metal compound layer 9b is formed as the substrate 3b moves approximately from the substrate position D to the substrate position E, and subsequently the metal layer 9c is formed as the substrate 3b moves forward from the substrate position E. Combined with the previously formed first transparent conductive metal compound layer 9a, the layers 9b and 9c constitute the back surface electrode layer 9 of a three-layer structure.

MANUFACTURING EXAMPLE 2

A thin-film solar cell is manufactured in a method similar to the above Manufacturing Example 1 with an exception that an Al target is used instead of the Ag target 25. In this example, the thickness of the second transparent conductive metal compound layer 9b was about 30 Å.

Ag and Al used in the above examples are suitable as materials of the back surface electrode layer 9 that can provide a high reflectance. In either case, a thickness of 1,000 Å is needed to provide the characteristics required for a solar cell. However, the thickness may be set properly in a range of 1,000 Å to about 1 $\mu$m in consideration of various purposes such as maintaining sufficient mechanical strength and obtaining necessary coverage of connection steps in, for instance, an integrated structure. Another structure may be possible in which Ag is laid on the second transparent conductive metal compound layer 9b to secure a necessary reflectance and Al is further laid thereon to secure sufficient mechanical strength.

It is noted that the referenced figures are intended only to illustrate the content of the invention in a specific manner and do not stringently express, in a definitive manner, the regions where the second transparent conductive metal compound layer 9b and the metal layer 9c are formed. Further, the plasma regions Pz, Pa and Pza do not appear definitively at the illustrated positions.

For comparison with the thin-film solar cells manufactured above according to the invention, there were also manufactured a thin-film solar cell in which the back surface electrode layer was constituted only of Ag (Comparative Example 1) and a thin-film solar cell in which the back surface electrode layer assumed a two-layer structure of ZnO and Ag (Comparative Example 2). The adhesive strength of the back surface electrode layer and the power generation characteristic of the solar cells of the invention and the two comparative examples were examined. The adhesive strength of the back surface electrode was evaluated by a peeling test using "Post-it tape" and "Scotch tape" both are produced by Sumitomo 3M Ltd., and the power generation characteristic was evaluated in terms of a short-circuit current density with light intensity of AM 1.5 to 100 mW/cm$^2$. The adhesion force of "Post-it tape" is weaker than that of "Scotch tape."

Results were as follows. In Comparative Example 1, the back surface electrode layer was easily stripped off by "Post-it tape." In Comparative Example 2, most of the back surface electrode layer was stripped off by "Scotch tape" with Ag slightly left at peripheral portions of the substrate. Observation of the stripped-off portions revealed that ZnO remains on the substrate, which means that the peeling occurred at the Ag-ZnO boundary. In contrast, in the back surface electrode layer of each of Manufacturing Examples 1 and 2, neither "Post-it tape" nor "Scotch tape" caused any peeling. Even a peeling test using a packing tape that has stronger adhesion force than "Scotch tape" showed no peeling of the back surface electrode layer, and the glass substrate was broken instead.

As seen from the above tests, the invention can greatly improve the adhesive strength of the back surface electrode layer of the thin-film solar cell without the need of performing any heat treatment such as sintering, though Ag or Al is used as the back surface electrode material.

As for the power generation characteristic, while the short-circuit current density was 17 mA/cm$^2$ in each of Comparative Examples 1 and 2, it was 18 mA/cm$^2$ in each of Manufacturing Examples 1 and 2 of the invention. It was also proved that the reflectance of the back surface electrode layer was improved. As one factor of the improvement in the reflectance, it is presumed, as is evidenced by the low adhesive strength itself, that in each of Comparative Examples 1 and 2 the boundary with low adhesive strength is microscopically discontinuous in adhesive contact, which prohibits efficient reflection.

In addition to the material given above, heat resistant transparent resin films such as PET and polyimide which attract much attention in recent years may also be used as the insulative transparent substrate 3. With the use of one of those transparent resin films, a solar cell can be rendered flexible.

In addition to SnO$_2$, such materials as ZnO and ITO can be used as the transparent electrode layer 5. As described above, it is preferred that the surface of the transparent electrode layer 5 be formed with asperities to confine long-wavelength light within the thin-film semiconductor layer 7. In addition to ZnO, such materials as ITO and SnO$_2$ can be used as the first transparent conductive metal compound layer 9a. To obtain higher adhesive strength, it is desired that the same materials contact with each other in the back surface electrode layer 9, that is, the first and second transparent conductive metal compound layers 9a and 9b can be made of the same material.

While the amorphous silicon-type semiconductor having a single p-i-n junction is used in the above embodiment to constitute the thin-film semiconductor layer 7, there can also be used a tandem type semiconductor in which the above semiconductor is laid one on another to assume multiple layers, as well as thin-film polycrystalline silicon, a CuInSe$_2$-type semiconductor, and a composite film thereof. Where CuInSe$_2$ is used to constitute the thin-film semiconductor layer 7, it is desired that CdS be used as a material of the transparent electrode layer 3 and the first and second transparent conductive metal compound layers 9a and 9b.

In addition to the method of the above embodiment, the following method may also be used to form the back surface electrode layer 9. The following description is directed to a case where the targets are respectively made of ZnO and Ag. Referring to FIG. 3, instead of the substrate 3b, the substrate 3a bearing the transparent electrode layer 5 and the thin-film semiconductor layer 7 is placed at the substrate position A. As the substrate 3a is moved to the vicinity of the substrate position D, the ZnO target 23 is energized at an ordinary discharge power density. When the substrate 3a reaches the vicinity of the substrate position D, a plasma region Pa is formed by supplying discharge power to the Ag target 25 and, at the same time, plasma regions Pz and Pza are formed by reducing the discharge power density of the ZnO target 23 to 10% or less of that of the Ag target 25 or shutting off the discharge power to ZnO target 23, in the latter case of which induction energy or parasitic discharging from the Ag target 25 is utilized. At this time, a first transparent conductive metal compound layer 9a is formed (therefore, the substrate 3a has turned into the substrate 3b). Thereafter, a second transparent conductive metal compound layer 9b is formed as the substrate 3b is moved from the substrate position D to E, and an Ag metal layer 9c is formed as it is moved from the substrate position E onward. According to this method, the first transparent conductive metal compound layers 9a and 9b and the metal layer 9c can be formed as the substrate 3b is moved continuously without moving the substrate 3b in the opposite direction after the formation of the first transparent conductive metal compound layer 9a which is the case of the above embodiment. But this method is still the same as the above embodiment in that after the formation of the first transparent conductive metal compound layer 9a on the thin-film semiconductor layer 7, the back surface electrode layer 9 is formed on the thin-film semiconductor layer 7 as the substrate 3b is moved through a plurality of plasma regions Pa, Pz and Pza formed in the reaction chamber 17 from the ZnO target 23 side to the Ag target 25 side.

It is also possible to install three targets for the first and second transparent conductive metal compound layers 9a and 9b and the metal layer 9c in the sputtering apparatus 15. Further, in the Manufacturing Example described above in connection with FIG. 3, the energy of forming the plasma region Pz over the ZnO target 23 may be supplied through induction energy or parasitic discharging that results from the discharge power of the Ag target 25.

As a further modification, the second transparent conductive metal compound layer 9b may be formed by using the sputtering apparatus of FIGS. 2 and 3 after the first transparent conductive metal compound layer 9a is formed by using a separate film forming apparatus. However, in this case, if there is a fear that impurities are absorbed between the first and second transparent conductive metal compound layers 9a and 9b, impurities absorbed on the surface of the first transparent conductive metal compound layer 9a may be removed before formation of the second transparent conductive metal compound layer 9b by performing, for instance, Ar bombardment in the sputtering apparatus 15.

Figure 4:
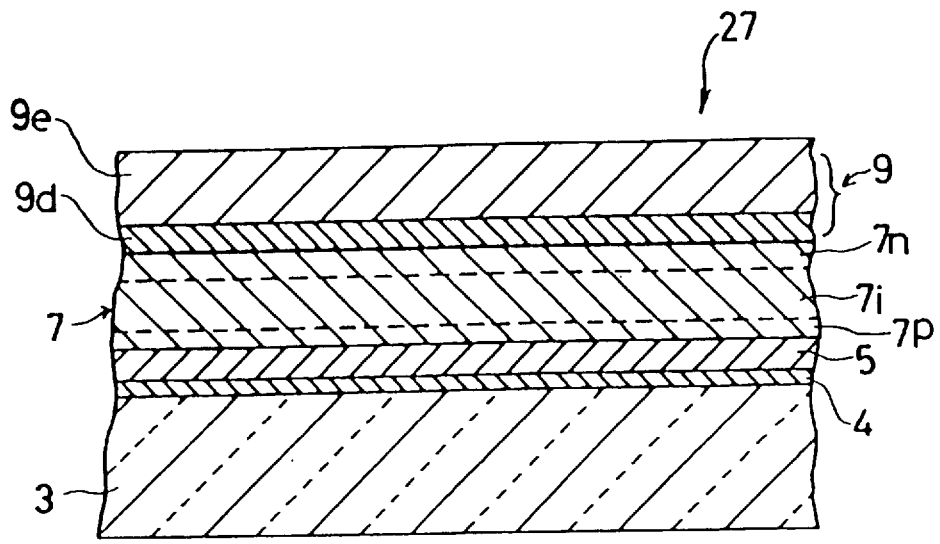
FIG. 4 is a sectional view showing the structure of a thin-film solar cell according to a second aspect of the invention.

Next, a thin-film solar cell according to a second aspect of the invention will be described below. FIG. 4 is a sectional view showing the structure of a thin-film solar cell 27 according to the second aspect of the invention. As shown, the thin-film solar cell 27 is constructed such that a transparent electrode layer 5, a thin-film semiconductor layer 7, and a back surface electrode layer 9 are laid in stated order on an insulative transparent substrate 3 in which the back surface electrode layer 9 has a layered structure of an intermediate thin layer 9d and an Ag thin film 9e. The intermediate thin layer 9d, which is formed on the thin-film semiconductor layer 7 in which p, i and n-type layers are laid in this order from the transparent electrode layer 5 side, contains Ag, O and Zn and is not thicker than 20 Å preferably. The Ag thin film 9e is formed on the intermediate thin layer 9d. This structure can provide high adhesive strength because no contact of different materials occurs at both top and bottom boundaries of the intermediate thin layer 9d. Even though the intermediate thin layer 9d is very thin, that is, as thin as about 20 Å as mentioned above, it assures sufficient increase in the adhesive strength. If the intermediate thin layer 9d is thicker than 20 Å, it is dark, that is, low in transmittance, so that the quantity of light reaching the Ag thin film 9e is small, which means that the reflecting action of the back surface electrode layer 9 is impaired. Thus, it is desired that the thickness of the intermediate thin layer be 20 Å or less.

If necessary, a $SiO_2$ undercoat 4 may be formed on the insulative transparent substrate 3 as a layer for preventing intrusion of impurities.

Figure 5:
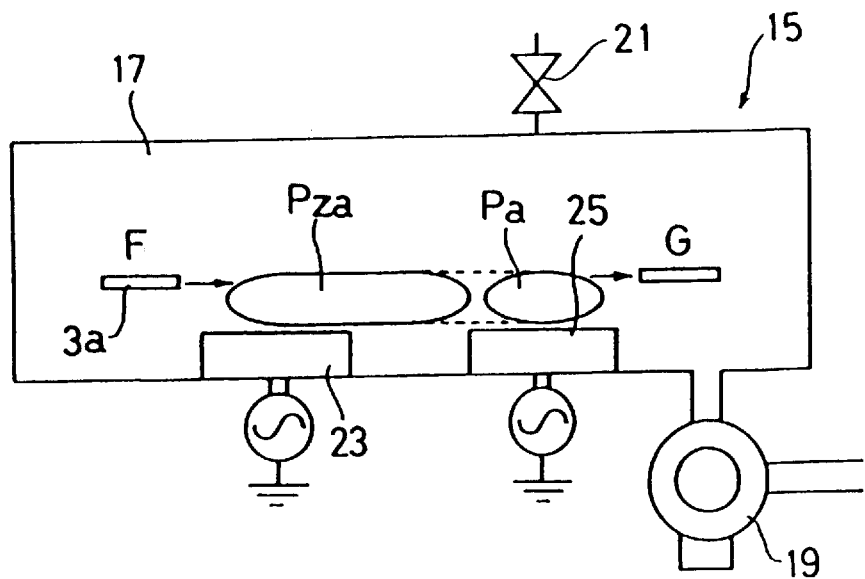
FIG. 5 illustrates Manufacturing Example 3.

The above structure is produced by the following manufacturing method. FIG. 5 shows an example of the structure of a magnetron-type in-line sputtering apparatus 15 to produce the thin-film solar cell 27 according to the second aspect of the invention. This apparatus is so configured that at least ZnO and Ag targets can be set therein. The thin-film solar cell 27 is obtained by inputting, to this apparatus, a substrate 3a on which the transparent electrode layer 5 and the thin-film semiconductor layer 7 are formed. The ZnO target may contain Al at 5% in the form of $Al_2O_3$. The manufacturing method will be hereinafter described in detail.

The substrate 3a on which the transparent electrode layer 5 and the thin-film semiconductor layer 7 is formed are set at a substrate position F in a reaction chamber 17 of the magnetron-type in-line sputtering apparatus 15. After the reaction chamber 17 is evacuated with a vacuum pump 19, discharging is caused by supplying RF power to only the Ag target 25 while the internal pressure is kept at a given value by introducing an Ar gas from a gas system 21. As a result of this discharging, a plasma region Pa made almost only of Ag is formed over the Ag target 25 and a very weak plasma region Pza that is a mixture of Ag, O and Zn extends from an end portion of the Ag target section 25 to over the ZnO target 23. FIG. 5 is drawn such that the ZnO target 23 can also be supplied with RF power because it shows the structure of the in-line sputtering apparatus 15. In the invention, RF power is supplied to only the Ag target 25 by turning off RF power to the ZnO target 23.

The thin-film solar cell 27 is produced by moving the substrate 3a through the above plasma regions Pa and Pza from the ZnO target 23 side to a substrate position G that is located ahead of the Ag target 25. That is, the intermediate thin layer 9d is deposited mainly over the ZnO target 23 and the Ag thin film 9e is deposited mainly over the Ag target 25. The thickness of the intermediate thin film 9d can be controlled at 20 Å or less by setting the density of the RF power applied to the Ag target 25 and the substrate movement speed at optimum values.

A specific example of manufacture will be described below in detail with reference to FIGS. 4 and 5.

MANUFACTURING EXAMPLE 3

A glass substrate coated with a 500-Å-thick $SiO_2$ layer 4 is used as an insulative transparent substrate 3. A transparent electrode layer 5 is laid on the substrate 3 by forming a fluorine-added $SnO_2$ film at a thickness of about 8,000 Å. To reduce loss of light by reflection, the surface of the $SnO_2$ film is formed with minute asperities. In addition to $SnO_2$, such materials as ZnO and ITO may also be used to form the transparent electrode layer 5.

Thereafter, a thin-film semiconductor layer 7 is formed by successively laying 150-Å-thick p-type a-SiC:H layer 7p, a 4,000-Å-thick i-type a-Si:H layer 7i, and a 500-Å-thick n-type μc-Si:H layer 7n on the transparent electrode layer 5 by using a plasma CVD apparatus.

Subsequently, after a substrate 3a on which the above layers have been formed is set at the substrate position F in the reaction chamber 17 of the magnetron-type in-line sputtering apparatus 15 shown in FIG. 5, the reaction chamber 17 is evacuated with the vacuum pump 19 to $6 \times 10^{-6}$ torr. In a state that an Ar gas is introduced from the gas system 21 and the internal pressure is kept at $3 \times 10^{-3}$ torr, the Ag target 25 is subjected to sputtering by energizing it at a RF power density of 0.8 $W/cm^2$. In this state, the substrate 3a is moved through the two plasma regions Pa and Pza from the substrate position F to G, whereby a 20-Å-thick intermediate thin layer 9d and a 5,000-Å-thick Ag thin film 9e are deposited, that is, a back surface electrode layer 9 is formed. As for the thickness of the Ag thin film 9e, 1,000 Å is needed to provide the characteristics required for a solar cell. However, the thickness may be set properly in a range of 1,000 Å to about 1 μm in consideration of various purposes such as maintaining sufficient mechanical strength and obtaining necessary coverage of connection steps in, for instance, an integrated structure. It is noted that the referenced figures are intended only to illustrate the content of the invention in a specific manner. Actually, the two plasma regions Pa and Pza are so formed as to be almost continuous as indicated by broken lines in FIG. 5. Therefore, the regions of Pa and Pza shown in FIG. 5 do not stringently express, in a definitive manner, the regions where the intermediate thin layer 9d and the Ag thin film 9e are formed. Further, the plasma regions Pa and Pza do not appear definitively at the illustrated positions.

For comparison with the thin-film solar cell manufactured above according to the invention, there was also manufactured a thin-film solar cell of Comparative Example 3 in which the back surface electrode layer was constituted only of Ag (same as the solar cell of Comparative Example 1). The adhesive strength of the back surface electrode layer and the power generation characteristic of the solar cells of the invention and the Comparative Example 3 were examined. The adhesive strength of the back surface electrode was evaluated by a peeling test using "Post-it tape" and "Scotch tape" both produced by Sumitomo 3M Ltd., and the power generation characteristic was evaluated in terms of a short-circuit current density with light intensity of AM 1.5–100 $mW/cm^2$. The adhesion force of "Post-it tape" is weaker than that of "Scotch tape."

Results were as follows. In the back surface electrode layer of the thin-film solar cell according to the second aspect of the invention (Manufacturing Example 3), neither "Post-it tape" nor "Scotch tape" caused any peeling. Even a peeling test using a packing tape that has stronger adhesion force than "Scotch tape" showed no peeling of the back surface electrode layer, and the glass substrate was broken instead. In contrast, in Comparative Example 3, the back surface electrode layer was easily stripped off by "Post-it tape."

As seen from the above tests, also in the thin-film solar cell according to the second aspect of the invention, the adhesive strength of the back surface electrode layer can be greatly improved, although Ag is used as the back surface electrode material.

As for the power generation characteristic, while the short-circuit current density was 17 mA/cm$^2$ in Comparative Example 3, it was 18 mA/cm$^2$ in the thin-film solar cell according to the second aspect of the invention, which value is the same as in that according to the first aspect of the invention. It was also proved that the reflectance of the back surface electrode layer was improved. As one factor of the improvement in the reflectance, it is presumed that in the comparative example the boundary with low adhesive strength is microscopically discontinuous in adhesive contact, which prohibits efficient reflection. In contrast, based on the fact that the adhesive strength is improved in the thin-film solar cell according to the second aspect of the invention, it is believed that each of the boundaries between the thin-film semiconductor layer 7 and the intermediate thin layer 9$d$ and between the intermediate thin layer 9$d$ and the Ag thin film 9$e$ microscopically has continuous and uniform adhesion.

The invention can be applied to various purposes other than thin-film solar cells as described above. For example, when applied to a mirror in which an Ag thin film is formed on a glass plate, the invention can provide superior adhesive strength and reflectance.

According to the thin-film solar cells according to the invention, silver, which conventionally could not be used easily for industrial purposes because it suffered from low adhesive strength when bonded to a thin-film semiconductor layer, can now be used in the back surface electrode layer with high adhesive strength. Therefore, a high output can be obtained by efficiently reflecting incident light that has passed through the thin-film semiconductor layer at the boundary between the back surface electrode layer and the thin-film semiconductor layer. Thus, the thin-film solar cells of the invention have a very wide range of use in providing high-output, highly reliable alternative energy at a low cost. Capable of being applied to purposes other than thin-film solar cells, such as mirrors, the invention can be applied to a variety of purposes.

What is claimed is:

1. A thin-film solar cell including a transparent electrode layer, a thin-film semiconductor layer, and a back surface electrode layer which are laid in order on an insulative transparent substrate and comprising:
    a back surface electrode layer comprising a layered body comprising a first transparent conductive metal compound layer having a smaller refractive index than a semiconductor that constitutes the thin-film semiconductor layer; a second transparent conductive metal compound layer; and a metal layer,
    wherein the components of adjacent layers are mixed with each other around at least one of the boundaries between the first transparent conductive metal compound layer and the second transparent conductive metal compound layer or between the second transparent conductive metal compound layer and the metal layer in a continuous transition from 100% material of one layer to 100% material of the next layer near the boundaries.

2. The thin-film solar cell according to claim 1, wherein the first transparent conductive metal compound layer comprises a metal oxide.

3. The thin-film solar cell according to claim 2, wherein the metal oxide comprises any one selected from indium tin oxide, tin oxide, and zinc oxide.

4. The thin-film solar cell according to claim 1, wherein the first transparent conductive metal compound layer comprises cadmium sulfide.

5. A thin-film solar cell including a transparent electrode layer, a thin-film semiconductor layer, and a back surface electrode layer which are laid in order on an insulative transparent electrode layer,
    wherein the back surface electrode layer comprises a layered body comprising:
        a silver thin film; and
        an intermediate thin layer containing silver, oxygen, and a metal element constituting a transparent conductive metal oxide,
    wherein components of adjacent layers mix with each other around in boundaries between the silver thin film and the intermediate thin layer in a continuous transition from 100% material of one layer to 100% material of the next layer near the boundaries.

6. The thin-film solar cell according to claim 5, wherein the metal element constituting the transparent conductive metal oxide comprises zinc.

* * * * *